(12) United States Patent
Lin et al.

(10) Patent No.: US 7,203,888 B2
(45) Date of Patent: Apr. 10, 2007

(54) SYSTEM AND METHOD FOR CORRECTING LINEAR BLOCK CODE

(75) Inventors: Li-Lien Lin, Hsin-Chu (TW); Wen-Yi Wu, Hsin-Chu (TW)

(73) Assignee: MediaTek Inc., Hsin-Chu (TW)

(*) Notice: Subject to any disclaimer, the term of this patent is extended or adjusted under 35 U.S.C. 154(b) by 593 days.

(21) Appl. No.: 10/648,197

(22) Filed: Aug. 27, 2003

(65) Prior Publication Data

US 2004/0143784 A1 Jul. 22, 2004

(30) Foreign Application Priority Data

Dec. 18, 2002 (TW) .............................. 91136566 A

(51) Int. Cl.
*H03M 13/00* (2006.01)
(52) U.S. Cl. ....................... 714/758; 714/761
(58) Field of Classification Search ................ 714/758, 714/761
See application file for complete search history.

(56) References Cited

U.S. PATENT DOCUMENTS 4,151,510 A * 4/1979 Howell et al. .............. 714/758
5,487,077 A * 1/1996 Hassner et al. ............. 714/762
5,909,541 A * 6/1999 Sampson et al. .............. 714/6
6,018,304 A * 1/2000 Bessios ....................... 341/58
6,615,387 B1* 9/2003 Williamson et al. ........ 714/785

* cited by examiner

*Primary Examiner*—Guy Lamarre
*Assistant Examiner*—Mujtaba K. Chaudry
(74) *Attorney, Agent, or Firm*—Troxell Law Office PLLC

(57) ABSTRACT

The present invention is a correcting system for correcting a linear block code generated by coding an original data via a data coding process when a predetermined correction portion of an original data is corrected by a variant correction data. The correcting system comprises a coding module and a correcting module. The coding module is used to code the variant correction data via the data coding process to generate a corresponding variant correction code. The correcting module is used to store the variant correction code and calculate the variant correction code and the linear block code to generate a substitute code to substitute the linear block code. Therefore, if the data is modified after an optical recording system has completed coding the data, the optical recording system could add the substitute code to generate the renewed linear block code, unnecessarily reprocessing the complicated data coding process.

19 Claims, 3 Drawing Sheets

SYSTEM AND METHOD FOR CORRECTING LINEAR BLOCK CODE

BACKGROUND OF THE INVENTION

1. Field of the Invention

The present invention relates to a system and method for correcting a linear block code, and more particularly, to a system and method applied to an optical recording system for correcting a linear block code.

2. Description of the Prior Art

When an optical recording system is writing or reading the data, it is needed to proceed coding or decoding data in advance. For example, when a digital versatile disc (DVD) is coding and writing the data, an ECC block (Error Correction Code block) is regarded as a unit. The digital data of an ECC block is written in DVD in sequence.

The digital data which are going to be written in DVD are decomposed into a plurality of main data, each of which is 2048 bits, and temporarily stored in a buffer memory in an optical recording system. In a DVD system, each main data has an identification data with 4 bits to represent the position and number and a copyright management information with 6 bits about copyright. The first step of coding the digital data in the DVD system is to proceed error-detecting calculation for calculating the identification data to get an identification error detection code with 2 bits.

After acquiring the identification error detection code, the DVD system temporarily stores the identification data, the identification error detection code, the copyright management information, and the main data into the buffer memory in DVD system, wherein each block is with a form of 12×172 (12 rows and 172 lines). Then the DVD system reads the data temporarily stored in the memory and proceeds error-detecting calculation for the data to acquire an error detection code (EDC).

The identification error detection code and the error detection code use cyclic redundancy code (CRC) to detect whether the data being read out has any error. The CRC, with a good error detecting ability, is used to detect errors. But the CRC can not correct the error data. Therefore, the CRC of prior art can only used to detect errors. Hence, during the coding process for the digital data, calculating the error detection code is a very important step.

After calculating the error detection code, the DVD system reads the main data from the buffer memory, scrambling them to generate a scrambled data, and then storing the scrambled data into the buffer memory. After this step, a scrambled data sector is performed. Because each scrambled data sector is only detected by the error detection code without corrected by an error correction code, after detecting sixteen scrambled data sectors, the DVD system will correct the sixteen scrambled data sector by error correction calculation, in order to generate the error correction code. After the error correction code is stored into the buffer memory, an error detection block is performed.

However, during the data coding process, the problem of data modification often happens. For example, a situation, which one bit in the data changes from 1 to 0 or from 0 to 1, may happen. When this situation happens, the coding technology of prior art must resume calculating the error detection code and the error correction code. This will result in serious hardware waste and executing time waste.

To solve this problem, the U.S. Pat. No. 6,357,030 provides a solution particularly for the method of calculating the error correction code. U.S. Pat. No. 6,357,030 indicates a method which needs not to resume calculating the whole error detection block, but use only the error position and the bits change (from 0 to 1 or from 1 to 0) to resume calculating and generate the corrected error correction code, then adding the corrected error correction code into the original one to get the new error correction code.

However, when correcting, U.S. Pat. No. 6,357,030 has to resume calculating according to the wrong bits to get the error correction code for correction. It is not helpful for saving the hardware resource because the correction code cannot be quickly and directly written. Moreover, U.S. Pat. No. 6,357,030 does not correct the error detection code in the error detection block, so the error detection code still needs to resume calculating.

SUMMARY OF THE INVENTION

One of the purposes of the present invention is to provide a method for correcting the error detection code which avoids resuming calculating the error detection code when the data is modified.

A correction system for correcting the error detection code is used to correct an identification error detection code and an error detection code, when, in a original data, an identification data is added into the variant correction data. The identification error detection code is generated by the identification data via an identification coding process. The error detection code is generated by the original data via a data coding process. The correction system comprises a coding module and a correcting module. The coding module codes the variant correction data to generate a variant identification error detection code via the identification coding process and codes the variant correction data and the variant identification error detection code to generate a corresponding variant code via the data coding process. The correcting module stores the variant identification error detection code and the variant code and calculates the variant identification error detection code and the identification error detection code to generate a substitute identification error detection code to substitute the identification error detection code. Finally, based on the variant code and the error detection code, a substitute code is generated to substitute the error detection code.

When one of the original data is modified, the present invention can directly find the variant correction data and the corresponding variant code resulting in the data modification. Then the present invention calculates the variant code and the original error detection code to generate a substitute code to substitute the original error detection code. Therefore, the present invention does not have to repeat the complex data coding process so that saves the time that the system spent on modifying the data without wasting the hardware resource.

The advantage and spirit of the invention may be understood by the following recitations together with the appended drawings.

BRIEF DESCRIPTION OF THE APPENDED DRAWINGS

DETAILED DESCRIPTION OF THE PREFERRED EMBODIMENT

Figure 1:
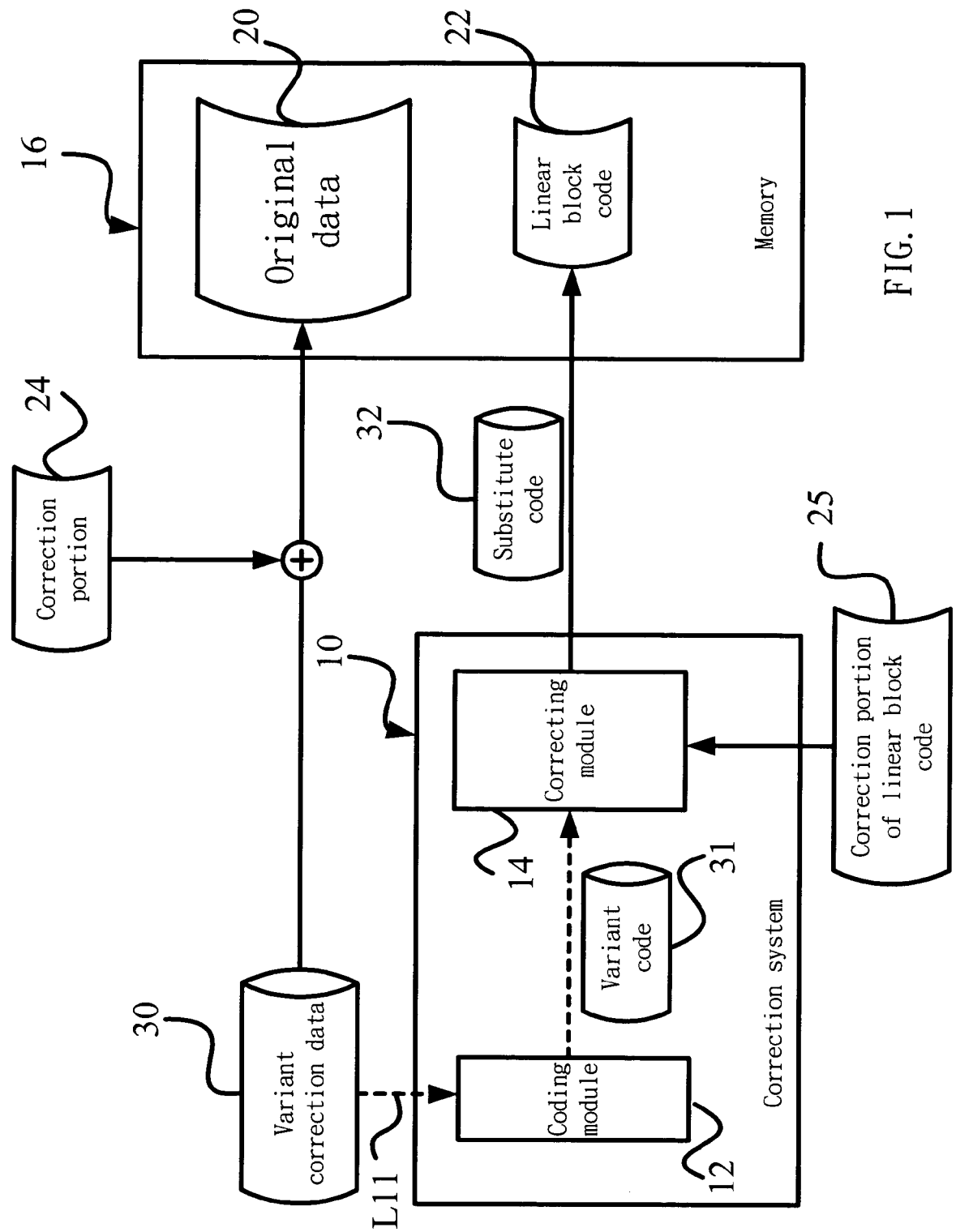
FIG. 1 is the schematic diagram of the correction system and the memory of the first embodiment in the present invention.

Please refer to FIG. 1. FIG. 1 is the schematic diagram of the correction system 10 and the memory 16 of the first embodiment in the present invention. After the optical recording system (not shown in FIG. 1) codes and temporarily stores a portion of data and if one of original data 20 of the portion of data is modified, that is an variant correction data 30 adds to a predetermined correction portion 24 of the original data 20 for correction, the present invention will provide a correction system 10 to correct a linear block code 22 generated by the original data 20 undergoing a data coding process. Wherein, the original data 20 and the linear block code 22 are temporarily stored in a memory 16 in the optical recording system.

The correction system 10 comprises a coding module 12 and a correcting module 14. Referring to FIG. 1, wherein the dotted line arrow L11 means the coding module 12 codes the variant correction data 30 in advance via the data coding process to generate a corresponding variant code 31 and stores the variant code 31 to the correcting module 14. The correcting module 14 calculates the variant code 31 and the correction portion 25 of the linear block code through XOR logic calculation to generate the substitute code 32, then writes the substitute code 32 and substitutes it for the linear block code 22. In the first embodiment of this invention, the coding module 12 is identical to the device which codes data in the optical recording system of prior art. Because the variant correction data 30 is known in advance, the coding module 12 can be substituted by software and transmit the result to the correcting module 14. That is, the coding module 12 can be a program module and need not to further increase the hardware of the optical recording system of prior art.

Thereby, the correction system 10 of the present invention directly adds the substitute code 32 to substitute for the original linear block code 22 to get the linear block code after modifying the original data 20. The kinds of the linear block code comprise an error detection code (EDC), an outer parity code (PO), and an inner parity code (PI) of error correction code. Therefore, when the original data 20 is modified, the optical recording system need not resume the data coding process for the corrected original data, thus this invention can effectively decrease the requirements for the hardware resources of the optical recording system and the bandwidth of the memory.

Figure 2:
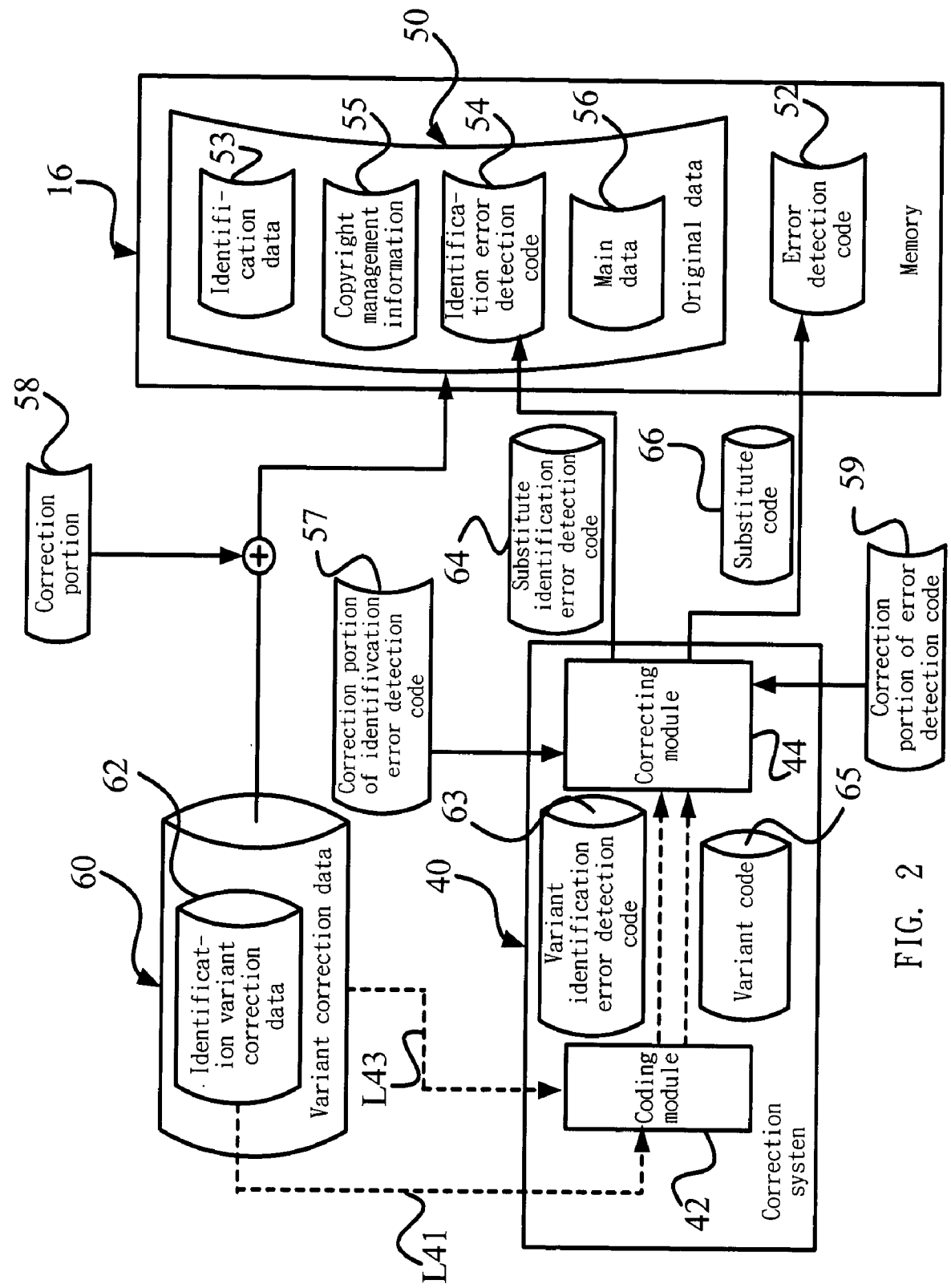
FIG. 2 is the schematic diagram of the correction system of the second embodiment in the present invention.

The first embodiment of this invention is for the situation that the original data 20 undergoes coding once and gets the corresponding linear block code 22. If the data contained in the original data 20 is after coding, the situation will be more complex. Please refer to FIG. 2. FIG. 2 is the schematic diagram of the correction system of the second embodiment in the present invention. In the second embodiment, an original data 50 and a corresponding error detection code 52 temporarily store in the memory 16. The original data 50 comprises an identification data 53, an identification error detection code 54, a copyright management information 55 and a main data 56. The identification data 53 is used to label the position from which the main data 56 comes. The identification error detection code 54 is used to detect and identify the identification data 53. The identification error detection code 54 is generated by coding the identification data 53 via a coding process of the identification error detection code. The copyright management information 55 is used to label the copyright of the original data 50.

In the embodiment of FIG. 2, the original data 50 comprises the identification data 53 and the identification error detection code 54. When a predetermined correction portion 58 in the original data 50 is modified by adding a variant correction data 60 and if the variant correction data 60 simultaneously modifies the identification data 53, (that means the variant correction data 60 comprises an identification variant correction data 62), the corresponding identification error detection code 54 of the identification data 53 also has to be modified with the identification data 53. Thus, the error detection code 52 corresponding to the original data 50 cannot merely modify the identification data 53 corresponding to the variant correction data 60. The error detection code 52 must confirm the modified identification error detection code 54 and acquire the complete content of the original data 50 after modified, then can modify the variant correction data according to the complete content.

Referring to FIG. 2, the correction system 40 comprises a coding module 42 and a correcting module 44. When a variant correction data 60 is added into the original data 50, and when the variant correction data 60 comprises the identification variant correction data 62 to correct the identification data 53, the correction system 40 is used to correct the identification error detection code 54, which is generated by the identification data 53 after an identification coding process, and to correct the error detection code 52, which is generated by the original data 50 after a data coding process.

Referring to FIG. 2, the dotted line L41 means coding module 42 in advance codes the variant correction data 60 of the identification code into a corresponding variant identification error detection code 63, according to the coding process of the identification error detection code. The correcting module 44 calculates the variant identification error detection code 63 and the correction portion 57 of the identification error detection code by XOR to generate the substitute identification error detection code 64 to substitute the original identification error detection code 54. Similarly, the dotted line L43 means the coding module 42 in advance codes the variant correction data 60 and the coded variant identification error detection code 63 into a corresponding variant code 65 via the coding process of the error detection code. The correcting module 44 stores the variant identification error detection code 63 and the variant code 65, so as to directly start correction calculation when modification occurs. The correcting module 44 calculates the variant code 65 and the correction portion 59 of the error detection code by XOR to generate the substitute code 66 to substitute the original error detection code 52. In the correction system 40 of the second embodiment, the coding module 42 is identical to the device which codes data in the prior optical recording system. The function of the coding module 42 can be substituted by software and the software transmits the result to the correcting module. Thus this invention does not have to increase the hardware requirement of the prior recording system.

Thereby, the correction system of the present invention directly adds the substitute identification error detection code 64 and the substitute code 66 to the original identification error detection code 54 and the error detection 52 to acquire the identification error detection code and the error detection code after modified the data. Thus, when the data is modified, the optical recording system need not to resume the data coding process for the modified data. So the hardware source and memory bandwidth of the optical recording system can be effectively saved.

Referring to FIG. 2, a real case is used to explain the present invention. Firstly, the coding process of the identification error detection code for calculating the identification error detection code is introduced. The identification data 53 is expressed as ID(x). The identification error detection code is expressed as IDE(x). The equation which the coding process of the identification error detection code used to calculate the identification error detection code is expressed as below:

$$IED(x) = \sum_{j=4}^{5} C_{0,j} x^{5-j} = \{ID(x) \cdot x^2\} \bmod \{g(x)\}$$

Wherein $$ID(x) = \sum_{j=0}^{3} C_{0,j} x^{3-j}, \ g(x) = (x+1)(x+\alpha),$$

and $\alpha$ is the root of the multinomial $p(x)=x^8+x^4+x^3+x^2+1$.

Then, the new identification data ID_NEW(x) is expressed as ID(x)+DATA_BIT(x), meanwhile the identification error detection data should also be modified to the new identification error detection code IED_NEW(x). The connection between the new identification data and the new identification error detection code should be expressed as below:

IED_NEW(x)={ID_NEW(x)·$x^2$}mod{g(x)}

Substitute ID_NEW(x)=ID(x)+DATA_BIT(x) into the connection and derive,

IED_NEW(x)

={(ID(x)+DATA_BIT(x))·$x^2$}mod{g(x)}

={ID(x)·$x^2$}mod{g(x)}+{DATA_BIT(x)·$x^2$}mod{g(x)}

=IED(x)+IED_DATA_BIT(x)

, wherein IED_DATA_BIT(x) is the variant identification error detection code.

Assuming that the variant correction data 60 is to modify one bit data in the modified identification data 53 from 0 to 1, according to above calculation, it means to add "h020000" into the original identification data 53. The "h020000" is the variant correction data 60 in the present invention. If "h020000" substitutes into the equation, the corresponding variant identification error detection code 63 "h3e3c" will be generated.

Secondly, the method of how the coding module in the present invention codes the error detection code is described. Because the error detection code must be modified with the modification of the identification data and identification error detection code, if the identification data is expressed as ID(x), the identification error detection code is expressed as IED(x), the copyright management information is expressed as CPR_MAI(x), and the main data is expressed as M(x), the method of how the data coding process codes the error detection code can be expressed as below:

$$EDC(x) = \sum_{i=31}^{0} b_i x^i = I(x) \bmod \{g(x)\}$$

-continued

Wherein, $I(x) = ID(x) + IED(x) + CPR\_MAI(x) + M(x) = \sum_{i=16511}^{32} b_i x^i$ Wherein b is the root of the multinomial $g(x)=x^{32}+x^{31}+x^4+1$ Similarly, express the new identification data ID_NEW(x) as ID(x)+DATA_BIT(x) and correspondingly express the new identification error detection code IED_NEW(x) as IED(x)+IED_DATA_BIT(x) and the new error detection code as EDC_NEW(x). The equation of how the coding process of data calculates the error detection code can be expressed as below:

EDC_NEW(x)

={ID_NEW(x)+IED_NEW(x)+CPR_MAI(x)+M(x)}mod{g(x)}

={ID(x)+IED(x)+CPR_MAI(x)+M(x)}mod{g(x)}+ {DATA_BIT(x)+IED_DATA_BIT(x)}mod{g(x)}

=EDC(x)+{DATA_BIT(x)+IED_DATA_BIT(x)}mod{g(x)}

From above equation, the new error detection code can be decomposed to the original error detection code with the correction data and the correction code derived from calculating and coding the data of the identification error detection correction code.

Assuming that the variant correction data 60 is to modify one bit data in the modified identification data 53 from 0 to 1, according to above calculation, it means to add "h020000" into the original identification data 53. "h020000" is the variant correction data of the present invention. If "h020000" substitutes into the equation, the corresponding variant code "hbc8ea19d" will be generated.

From the above result, when the optical recording system codes the data and if for the code data finishing modification, one bit in the identification data changes from 0 to 1, the optical recording system just needs to use the correction system 40 of this invention to transmit the calculated variant identification error detection code "h3e3c" generated to the correcting module 44. The correcting module 44 calculates the variant identification error detection code and the identification error detection code by XOR logic calculating to generate the substitute identification error detection code to substitute the original identification error detection code, and transmit the variant error detection code "hbc8ea19d" to the correcting module 44. The correcting module 44 calculates the variant error detection code and the modified portion of error detection code by XOR logic calculating to generate the substitute code to substitute the original error detection code and need not to resume the coding process of the identification error detection code and the data coding process.

Therefore, the correction system in the present invention need not to recalculate the identification correction data and can use the identification error detection correction code calculated before to put into the original identification error detection code. This is much more convenient than prior arts.

Figure 3:
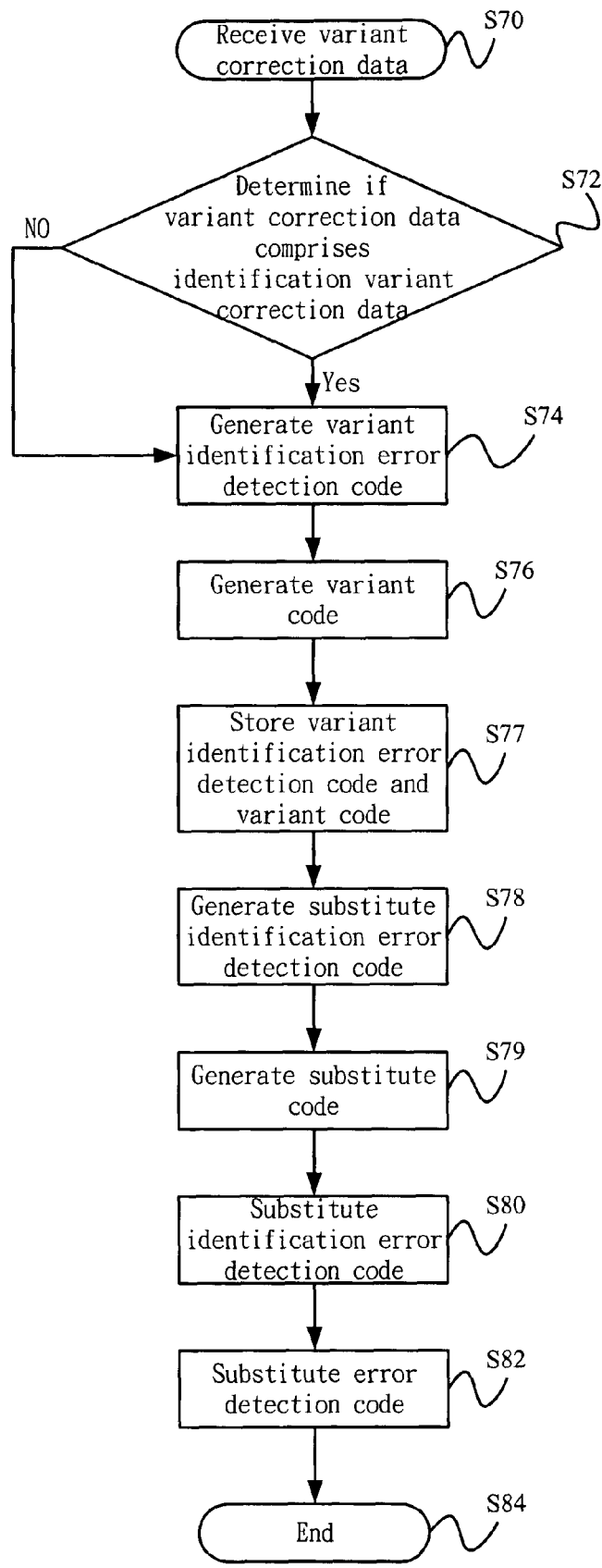
FIG. 3 is the flow chart of the correction method of the present invention.

Please refer to FIG. 3. FIG. 3 is a flow chart for the correction method of the present invention. The correction method of the error detection code for the present invention comprises the below steps:

Step S70: start, receiving the variant correction data 60;

Step S72: judging whether the variant correction data 60 comprises the identification variant correction data 62; if yes, going to step S74 and if no, going to step S76;

Step S74: coding the identification variant correction data 62 in advance via the identification coding process to generate the variant identification error detection code 63;

Step S76: coding the variant correction data 60 and the variant identification error detection code 63 via the data coding process to generate a corresponding variant code 65;

Step S77: storing the variant identification error detection code 63 and the variant code 65;

Step S78: calculating the variant identification error detection code 63 and the correction portion 57 of the identification error detection code by XOR logic calculating to generate the substitute identification error detection code 64;

Step S79: calculating the variant 65 and the correction portion 59 of the error detection code by XOR logic calculating to generate the substitute code 66;

Step S80: substituting the identification error detection code 54 for the substitute identification error detection code 64;

Step S82: substituting the error detection code 52 according to the substitute code 66;

Step S84: end.

After finishing the error detection code coding and if the original data coded is modified and the modified variant portion is known, the prior art needs to resume the complex data coding process to get the new error detection code. Through the present invention, for all linear block coding, by directly finding out the modified data result in data modification and the corresponding correction code, the correcting system can directly correct the error detection code before modified to generate the new error detection code. Therefore, the invention can save a lot of time for the optical recording system to modify data and will not consume the hardware resources.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A correcting system, when a predetermined correction portion of an original data is corrected by an variant correction data, for correcting a linear block code generated by coding the original data via a data coding process, said correcting system comprising:
   a coding module for
      coding said variant correction data via said data coding process to generate a corresponding variant correction code; and
   a correcting module for
      storing said variant correction code; and
      based on said variant correction code and said linear block code, generating a substitute code to substitute said linear block code.

2. A correcting system of claim 1, wherein said coding module is a program module.

3. A correcting system of claim 1, wherein the original data comprises an identification data, an identification error detection code, and a main data, said identification data used to label the source position of the main data, the identification error detection code used to identify and detect the identification data.

4. A correcting system of claim 3, wherein said identification error detection code is generated by coding said identification data via an identification coding process.

5. A correcting system of claim 4, when said variant correction data comprises an variant identification correction data for correcting said identification data, wherein said coding module codes said variant identification correction data to generate a corresponding variant identification detection code via said identification coding process.

6. A correcting system of claim 5, wherein said correcting module uses a substitute identification error detection code generated by calculating said variant identification detection code and said identification detection code with XOR logic calculation to substitute said identification detection code.

7. A correcting system of claim 6, wherein said coding module codes said variant correction data and said variant identification detection code via said data coding process to generate said variant correction code.

8. A correcting system of claim 1, wherein said linear block code is an error detection code.

9. A correcting system of error detection code, when an identification data of an original data is corrected by an variant correction data, for correcting an identification error detection code generated by coding said identification data via an identification coding process, and correcting an error detection code generated by coding said original data via a data coding process, said correcting system comprising:
   a coding module for
      coding said variant correction data via said identification coding process to generate an variant identification error detection code; and
      coding said variant correction data and said variant identification error detection code via said data coding process to generate a corresponding variant code; and
   a correcting module for
      storing said variant identification error detection code and said variant code;
      calculating said variant identification error detection code and said identification error detection code to generate a substitute identification error detection code for substituting said identification error detection code; and
      calculating said variant code and said error detection code to generate a substitute code for substituting said error detection code.

10. A correcting system of claim 9, wherein said coding module is a program module.

11. A correcting system, comprising a coding module and a correcting module, said coding module coding an variant correction data via a data coding process to generate an variant code, said correcting module storing said variant code and calculating said variant code and a linear block code with XOR logic calculation to generate a substitute code for substituting said linear block code.

12. A correcting system of claim 11, wherein said linear block code is generated by coding an original data via said data coding process.

13. A correcting system of claim 11, wherein said coding module is a program module.

14. A correcting system of claim 11, wherein said linear block code is an error detection code.

15. A correcting system of claim 11, wherein said original data comprises an identification data, an identification error detection code and a main data, said identification data being used to label the source position of the main data, the identification error detection code being used to identify and detect the identification data.

16. A correcting system of claim 15, wherein said identification error detection code is generated by coding identification data via an identification coding process.

17. A correcting system of claim 16, when said variant correction data comprises an variant identification correction data for correcting said identification data, wherein said coding module codes said variant identification correction data via said identification coding process to generate a corresponding variant identification error detection code.

18. A correcting system of claim 17, wherein said correcting module uses a substitute identification error detection code generated by calculating said variant identification detection code and said identification detection code with XOR logic calculation to substitute said identification detection code.

19. A correcting system of claim 18, wherein said coding module codes said variant correction data and said variant identification error detection code via said data coding process to generate said variant code.

* * * * *